(12) United States Patent
Chae et al.

(10) Patent No.: US 12,302,671 B2
(45) Date of Patent: May 13, 2025

(54) LIGHTING DEVICE

(71) Applicant: LG INNOTEK CO., LTD., Seoul (KR)

(72) Inventors: Hyun Hee Chae, Seoul (KR); Jung Ho Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 540 days.

(21) Appl. No.: 17/626,151

(22) PCT Filed: Jul. 3, 2020

(86) PCT No.: PCT/KR2020/008728
§ 371 (c)(1),
(2) Date: Jan. 11, 2022

(87) PCT Pub. No.: WO2021/010630
PCT Pub. Date: Jan. 21, 2021

(65) Prior Publication Data
US 2022/0246807 A1    Aug. 4, 2022

(30) Foreign Application Priority Data
Jul. 12, 2019  (KR) .................. 10-2019-0084540

(51) Int. Cl.
*H01L 33/54* (2010.01)
*H01L 25/075* (2006.01)
(Continued)

(52) U.S. Cl.
CPC ....... *H10H 20/853* (2025.01); *H01L 25/0753* (2013.01); *H10H 20/855* (2025.01); *H10H 20/0363* (2025.01)

(58) Field of Classification Search
CPC ..... H01L 33/00–648; H01L 27/15–156; H01L 2933/00–0091; G02F 1/133603;
(Continued)

(56) References Cited

U.S. PATENT DOCUMENTS 7,847,912 B2   12/2010   Nishizawa et al.
8,568,012 B2   10/2013   Park
(Continued)

FOREIGN PATENT DOCUMENTS

CN   101320182   12/2008
CN   102128391    7/2011
(Continued)

OTHER PUBLICATIONS

Park Hyun Min English Translation (Year: 2019).*
(Continued)

*Primary Examiner* — Shahed Ahmed
*Assistant Examiner* — Rhys Poniente Sheker
(74) *Attorney, Agent, or Firm* — KED & ASSOCIATES, LLP

(57) ABSTRACT

An embodiment may include a lighting device comprising: a substrate; a light emitting device disposed on the substrate; a resin layer disposed on the light emitting device and covering the light emitting device; a diffusion layer disposed on the resin layer; an optical pattern disposed between the lower surface of the diffusion layer and the resin layer; and a cover layer surrounding the optical pattern, wherein the cover layer comprises a release agent.

16 Claims, 7 Drawing Sheets

(51) Int. Cl.
- *H01L 33/58* (2010.01)
- *H10H 20/853* (2025.01)
- *H10H 20/855* (2025.01)
- *H10H 20/01* (2025.01)

(58) Field of Classification Search
CPC .......... G02F 1/133606; F21W 2107/10; F21S 41/20; F21S 43/28135; F21V 5/00; F21K 9/60

See application file for complete search history.

(56) References Cited

U.S. PATENT DOCUMENTS

| | | | |
|---|---|---|---|
| 9,223,173 | B2 | 12/2015 | Park |
| 9,312,458 | B2 | 4/2016 | Park et al. |
| 10,312,224 | B2 | 6/2019 | Edmond et al. |
| 10,732,459 | B2 | 8/2020 | Park et al. |
| 10,754,172 | B2 | 8/2020 | Min et al. |
| 2008/0303976 | A1 | 12/2008 | Nishizawa et al. |
| 2011/0199788 | A1 | 8/2011 | Park |
| 2014/0036480 | A1 | 2/2014 | Park |
| 2016/0064620 | A1 | 3/2016 | Mastin et al. |
| 2019/0064537 | A1 | 2/2019 | Min et al. |
| 2020/0183234 | A1* | 6/2020 | Kim .................. G02F 1/133611 |

FOREIGN PATENT DOCUMENTS

| | | |
|---|---|---|
| CN | 208620278 | 3/2019 |
| JP | 2019-514217 | 5/2019 |
| KR | 10-2011-0082447 | 7/2011 |
| KR | 2013-0096208 | 8/2013 |
| KR | 10-2013-0138959 | 12/2013 |
| KR | 20130138959 A * | 12/2013 |
| KR | 10-2014-0059448 | 5/2014 |
| KR | 10-2019-0036938 | 4/2019 |
| KR | 20190036938 A * | 4/2019 |
| KR | 20190049663 A * | 5/2019 |

OTHER PUBLICATIONS

Park Moo Ryong English Translation (Year: 2013).*
Park Translation (Year: 2019).*
Chinese Office Action dated May 17, 2023 issued in Application No. 202080050866.7.
International Search Report dated Oct. 14, 2020 issued in Application No. PCT/KR2020/008728.
Korean Office Action dated Aug. 9, 2024 issued in Application No. 10-2019-0084540.

* cited by examiner

LIGHTING DEVICE

CROSS-REFERENCE TO RELATED PATENT APPLICATIONS

This application is a U.S. National Stage Application under 35 U.S.C. § 371 of PCT Application No. PCT/KR2020/008728, filed Jul. 3, 2020, which claims priority to Korean Patent Application No. 10-2019-0084540, filed Jul. 12, 2019, whose entire disclosures are hereby incorporated by reference.

TECHNICAL FIELD

The embodiment relates to a lighting device capable of improving light efficiency.

BACKGROUND ART

Typical lighting applications include vehicle lights as well as backlights for displays and signage.

The light emitting device, for example, a light emitting diode (LED) has advantages such as low power consumption, semi-permanent lifespan, fast response speed, safety, and environmental friendliness compared to conventional light sources such as fluorescent lamps and incandescent lamps. Such light emitting diodes are being applied to various lighting devices such as various display devices, indoor lights or outdoor lights.

In recent years, lamps employing light emitting diodes have been proposed as lighting for vehicles. Compared with incandescent lamps, light emitting diodes are advantageous in that they consume less power, but the emission angle of light emitted from the light emitting diodes used in vehicle lighting devices is small. There is a need to improve efficiency.

DISCLOSURE

Technical Problem

An embodiment may provide a lighting device capable of forming an air gap between a resin layer and a cover layer.

An embodiment may provide a lighting device in which light extraction efficiency of a light emitting device is improved.

Technical Solution

In an embodiment, a lighting device comprises a substrate; a light emitting device disposed on the substrate; a resin layer disposed on the light emitting device and covering the light emitting device; a diffusion layer disposed on the resin layer; an optical pattern disposed between a lower surface of the diffusion layer and the resin layer; and a cover layer surrounding the optical pattern, wherein the cover layer may include a release agent.

In an embodiment, a lighting device comprises a substrate; a light emitting device disposed on the substrate; a resin layer disposed on the light emitting device and covering the light emitting device; a diffusion layer disposed on the resin layer; an optical pattern disposed between a lower surface of the diffusion layer and the resin layer; and a cover layer surrounding the optical pattern, wherein a partial region of the diffusion layer may dispose to be spaced apart from the resin layer.

The optical pattern of the lighting device according to the embodiment includes a first optical pattern disposed under the diffusion layer, a second optical pattern disposed under the first optical pattern, and a third optical pattern disposed under the second optical pattern. and an area of the second optical pattern may be greater than an area of the first optical pattern and smaller than an area of the third optical pattern.

The optical pattern of the lighting device according to the embodiment may vertically overlap the light emitting device.

In the lighting device according to the embodiment, an air gap may be formed between the cover layer and the resin layer.

The air gap of the lighting device according to the embodiment may be formed on a side surface of the cover layer.

The cover layer of the lighting device according to the embodiment may be formed of a silicone release agent including a silicone resin or an acrylic release agent including an acrylic resin.

The thickness of the cover layer of the lighting device according to the embodiment may be 3 to 10 micrometers.

In the lighting device according to the embodiment, the first optical pattern, the second optical pattern, and the third optical pattern are formed of a plurality of dot patterns, and an area of each of the plurality of dot patterns may decrease as a distance from the light emitting device increases.

In the lighting device according to the embodiment, a number of the plurality of dot patterns of the second optical pattern may be less than a number of the plurality of dot patterns of the first optical pattern, and greater than a number of the plurality of dot patterns of the third optical pattern.

Advantageous Effects

The lighting device according to the embodiment may form an air gap between the cover layer and the resin layer without a separate manufacturing process, thereby reducing manufacturing cost.

The lighting device according to the embodiment may improve light extraction efficiency of the light emitting device by an air gap formed between the cover layer and the resin layer.

BEST MODE

Figure 1:
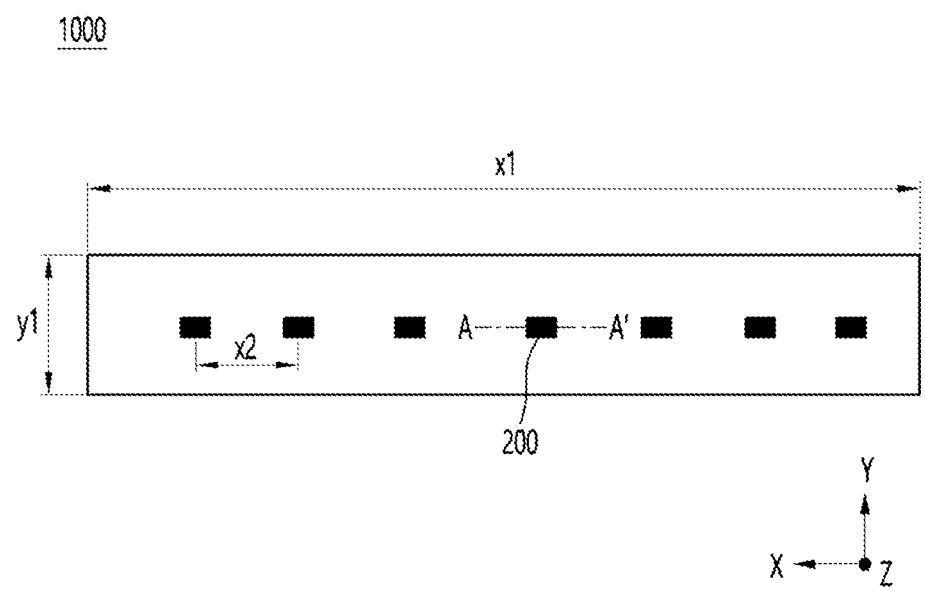
FIG. 1 is a plan view of a lighting device according to an embodiment.

Hereinafter, preferred embodiments of the present invention will be described in detail with reference to the accompanying drawings.

A technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention.

In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component.

In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to a variety of lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

Figure 2:
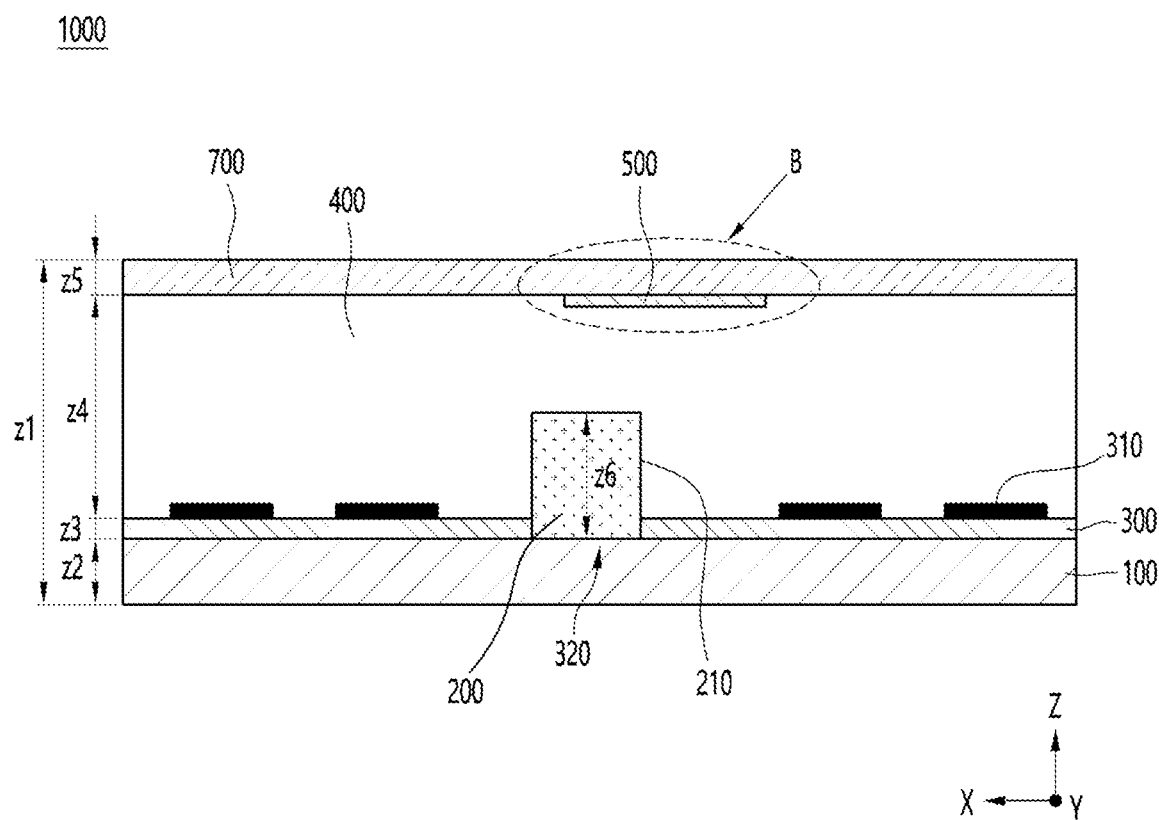
FIG. 2 is a cross-sectional view taken along line A-A' of the lighting device according to the embodiment.
Figure 3:
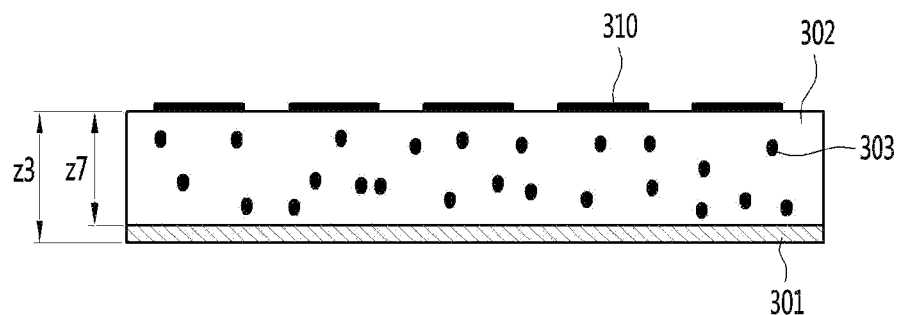
FIG. 3 is a cross-sectional view of a reflective member according to an embodiment.

FIG. 1 is a plan view of a lighting device 1000 according to an embodiment, FIG. 2 is a cross-sectional view taken along line A-A' of the lighting device 1000 according to the embodiment, and FIG. 3 is a cross-sectional view of a reflective member according to the embodiment. Referring to FIGS. 1 to 3, the lighting device 1000 according to the embodiment may include a circuit substrate 100, a light emitting device 200 disposed on the circuit substrate 100, and disposed on the circuit substrate 100, a reflective member 300 disposed on the circuit substrate 100, a reflective pattern 310 disposed on the reflective member 300, and a resin layer 400 disposed on the reflective member 300 and the reflective pattern 310 and covering the light emitting device 200, a diffusion layer 700 disposed on the resin layer 400, an optical pattern 600 disposed between the diffusion layer 700 and the resin layer 400, and a cover layer 500 covering the optical pattern 600.

The lighting device 1000 may emit light emitted from the light emitting device 200 as a surface light source. The lighting device 1000 may be applied to various lamp devices required for lighting, for example, a vehicle lamp, a home lighting device, and an industrial lighting device. For example, in the case of a lighting module may be applied to a vehicle lamp, a head lamp, a side lamp, a side mirror lamp, a fog lamp, a tail lamp, a turn signal lamp, a brake lamp (stop lamp), daytime running right, vehicle interior lighting, door scarf, rear combination lamp, backup lamp, etc.

Referring to FIGS. 1 and 2, the circuit substrate 100 is positioned under the diffusion layer 700, the resin layer 400, the reflective member 300, and the plurality of light emitting devices 200 and may function as a base member or a support member. The circuit substrate 100 may include a printed circuit board (PCB). For example, the circuit substrate 100 may include at least one of a resin-based printed circuit board (PCB), a metal core PCB, a flexible PCB, a ceramic PCB, or an FR-4 board. When the circuit substrate 100 is disposed as a metal core PCB having a metal layer disposed on the bottom thereof, heat dissipation efficiency of the light emitting device 200 may be improved.

The circuit substrate 100 may include a wiring layer (not shown) thereon, and the wiring layer may be electrically connected to the light emitting device 200. The circuit substrate 100 may include a reflective layer or a protective layer disposed on the wiring layer, which may protect the wiring layer. The plurality of light emitting devices 200 may be connected in series, parallel, or series-parallel by a wiring layer of the circuit substrate 100. In the plurality of light emitting devices 200, groups having two or more may be connected in series or in parallel, or a connection between the groups may be connected in series or in parallel.

The upper surface of the circuit substrate 100 may have an X-axis and Y-axis plane, and the thickness z2 of the circuit substrate 100 may be a height in the Z direction orthogonal to the X direction and the Y direction. Here, the X direction may be a first direction, the Y direction may be a second direction orthogonal to the X direction, and the Z direction may be a third direction orthogonal to the X direction and the Y direction.

The length x1 in the first direction of the circuit substrate 100 may be greater than the width y1 in the second direction. The length x1 in the first direction of the circuit substrate 100 may be twice or more, for example, 4 times or more, than the width y1 in the second direction. The thickness z2 of the circuit substrate 100 may be 1.0 mm or less, for example, in the range of 0.5 mm to 1.0 mm. In the lighting device 1000 according to the embodiment, the thickness z2 of the circuit substrate 100 may be provided to be thin, so that the thickness of the lighting device 1000 may not be increased. For example, since the thickness z2 of the circuit substrate 100 is provided to be 1.0 mm or less, it is possible to provide a flexible lighting device 1000. The circuit substrate 100 may include a transparent material through which light is transmitted through the upper and lower surfaces. The transparent material may include at least one of polyethylene terephthalate (PET), polystyrene (PS), and polyimide (PI).

The thickness z1 of the lighting device 1000 may be ⅓ or less of the shorter length among the lengths x1 and y1 in the first direction X and the second direction Y of the circuit substrate 100, but is not limited thereto. The thickness z1 of the lighting device 1000 may be 5.5 mm or less from a bottom of the circuit substrate 100 or may be in the range of 4.5 mm±0.5 mm. The thickness z1 of the lighting device 1000 may be a linear distance between the lower surface of the circuit substrate 100 and the upper surface of the diffusion layer 700. The thickness z1 of the lighting device 1000 may be 220% or less, for example, 180% to 220% of the thickness z4 of the resin layer 400. Since the lighting device 1000 has a thickness z1 of 5.5 mm or less, it may be provided as a flexible and slim surface light source module.

The light emitting device 200 is disposed on the circuit substrate 100 and may emit light in the first direction X. The light emitting device 200 emits light having the highest intensity in the first direction X. The light emitting device 200 may have an emission surface 210 from which light is emitted. For example, the emission surface 210 may be disposed in the third direction Z or a vertical direction with respect to a horizontal upper surface of the circuit substrate 100. The emission surface 210 may be a vertical plane, or may include a concave surface or a convex surface. The light emitting device 200 may be disposed on the circuit substrate 100 to be electrically connected to the circuit substrate 100.

The light emitting device 200 is a device including a light emitting diode (LED), and may include a package in which a light emitting chip is packaged. The light emitting device 200 may emit at least one of white, blue, red, green, infrared, and ultraviolet. The light emitting device 200 may be of a side view type in which a bottom portion is electrically connected to the circuit substrate 100, but is not limited thereto. As another example, the light emitting device 200 may be an LED chip, but is not limited thereto.

The emission surface 210 of the light emitting device 200 may be disposed on at least one side of the light emitting device 200 rather than the upper surface. The emission surface 210 may be a surface adjacent to the circuit substrate 100 among the side surfaces of the light emitting device 200. For example, the emission surface 210 may be a side adjacent to the upper surface of the circuit substrate 100. The emission surface 210 is disposed on a side surface between the bottom surface and the upper surface of the light emitting device 200, and emits light of the highest intensity in the first direction X. The emission surface 210 of the light emitting device 200 may be a surface adjacent to the reflective member 300 or a vertical surface to the upper surface of the circuit substrate 100 and the upper surface of the reflective member 300.

The light emitted through the emission surface 210 of the light emitting device 200 travels in a direction parallel to the upper surface of the circuit substrate 100, is reflected by the reflective member 300, or in a direction of the upper surface the resin layer 400. The thickness z6 of the light emitting device 200 may be 3 mm or less, for example, in the range of 0.8 mm to 2 mm. The length of the light emitting device 200 in the second direction Y may be 1.5 times or more of the thickness z6 of the light emitting device 200, but is not limited thereto. The light emitting device 200 may have a wider light beam angle in the ±Y direction than the light beam angle in the ±Z direction. The light beam angle of the light emitting device 200 in the second direction Y may be 110 degrees or more, for example, 120 degrees to 160 degrees or 140 degrees or more. The light beam angle in the third direction Z of the light emitting device 200 may be 110 degrees or more, for example, in a range of 120 degrees to 140 degrees.

The reflective member 300 may be disposed on the circuit substrate 100. The reflective member 300 may be disposed between the circuit substrate 100 and the resin layer 400. The reflective member 300 may be adhered to the upper surface of the circuit substrate 100. The reflective member 300 may have an area smaller than an area of the upper surface of the circuit substrate 100. The reflective member 300 may be spaced apart from the side surface of the circuit substrate 100, and the resin layer 400 may be attached to the spaced area on the circuit substrate 100. In this case, it is possible to prevent the edge portion of the reflective member 300 from peeling off by the resin layer 400.

The reflective member 300 may include an opening 320 in which a lower portion of the light emitting device 200 is disposed. In the opening 320 of the reflective member 300, the upper surface of the circuit substrate 100 is exposed and a portion to which the lower portion of the light emitting device 200 is bonded may be disposed. The size of the opening 320 may be the same as or larger than the size of the light emitting device 200, but is not limited thereto. The reflective member 300 may be in contact with the upper surface of the circuit substrate 100 or may be disposed between the resin layer 400 and the circuit substrate 100, but is not limited thereto. Here, the reflective member 300 may be removed when a highly reflective material is coated on the upper surface of the circuit substrate 100.

The reflective member 300 may be formed to have a thickness z3 smaller than a thickness z6 of the light emitting device 200. The thickness z3 of the reflective member 300 may include a range of 0.2 mm±0.02 mm. The emission surface 210 of the light emitting device 200 may be provided in a direction perpendicular to the upper surface of the reflective member 300.

The reflective member 300 may include a metallic material or a non-metallic material. The metallic material may include a metal such as aluminum, silver, or gold. The non-metallic material may include a plastic material or a resin material. The plastic material may be any one selected from the group consisting of polyethylene, polypropylene, polystyrene, polyvinyl chloride, polybiphenyl chloride, polyethylene terephthalate, polyvinyl alcohol, polycarbonate, polybutylene terephthalate, polyethylene naphthalate, polyamide, polyacetal, polyphenylene, polyamideimide, polyetherimide, polyetheretherketone, polyimide, polytetrafluoroethylene, liquid crystal polymer, fluororesin, copolymers thereof, and mixtures thereof. As the resin material, a reflective material, for example, a metal oxide such as $TiO_2$, $Al_2O_3$, $SiO_2$, may be added in silicon or epoxy. The reflective member 300 may be implemented as a single layer or multiple layers, and the light reflection efficiency may be improved by such a layer structure. The reflective member 300 according to an embodiment of the present invention reflects incident light, thereby increasing the amount of light so that the light is emitted with a uniform distribution.

Referring to FIG. 3, the reflective member 300 may include an adhesive layer 301, a reflective layer 302, and a reflective pattern 310. The adhesive layer 301 may attach the reflective member 300 to the upper surface of the circuit substrate 100. The adhesive layer 301 is a transparent material, and may be an adhesive such as UV adhesive, silicone, or epoxy.

The reflective layer 302 may be disposed on the adhesive layer 301. The reflective layer 302 is made of a resin material, and may include a plurality of reflective agents 303 therein. The reflective agent 303 may be a bubble such as air or a medium having the same refractive index as air. The resin material of the reflective layer 302 is a material such as silicone or epoxy, and the reflective agent 303 may be formed by injecting air bubbles into the resin material. The reflective layer 302 may reflect the light incident by the plurality of reflect agents 303 or refract it in a different direction. The thickness z7 of the reflective layer 302 may be 80% or more of the thickness of the reflective member 300.

A plurality of reflective patterns 310 in which a plurality of dots is arranged may be included on the reflective layer 302. The plurality of reflective patterns 310 may be formed on the reflective layer 302 by printing. The reflective pattern 310 may include reflective ink. The reflective pattern 310 may be printed with a material including any one of $TiO_2$, $CaCO_3$, $BaSO_4$, $Al_2O_3$, Silicon, and PS. Each dot of the reflective pattern 310 may have a hemispherical side cross-section or a polygonal shape. The material of the reflective pattern 310 may be white. Since the reflective pattern 310 is disposed on the upper surface of the reflective member 300 in the emission direction of the light emitting device 200, it is possible to improve light reflectance, reduce light loss, and improve the luminance of the surface light source.

Figure 4:
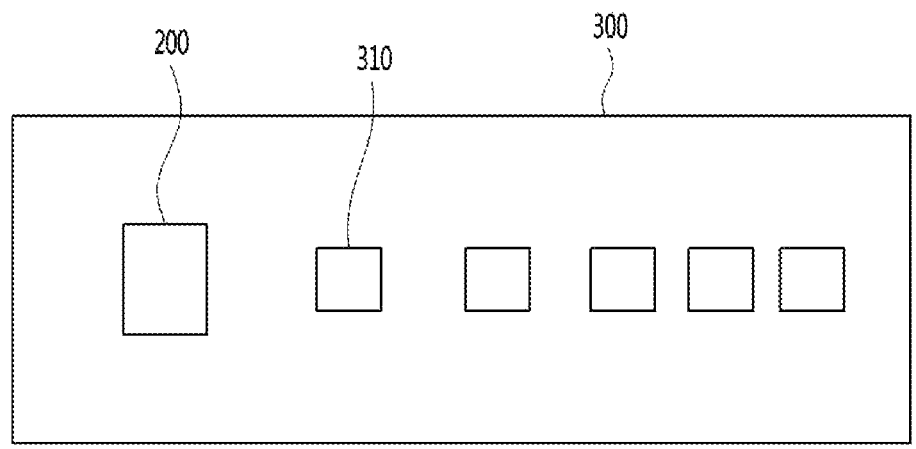
FIGS. 4 and 5 are plan views illustrating a modified example of a reflective pattern according to an embodiment.
Figure 5:
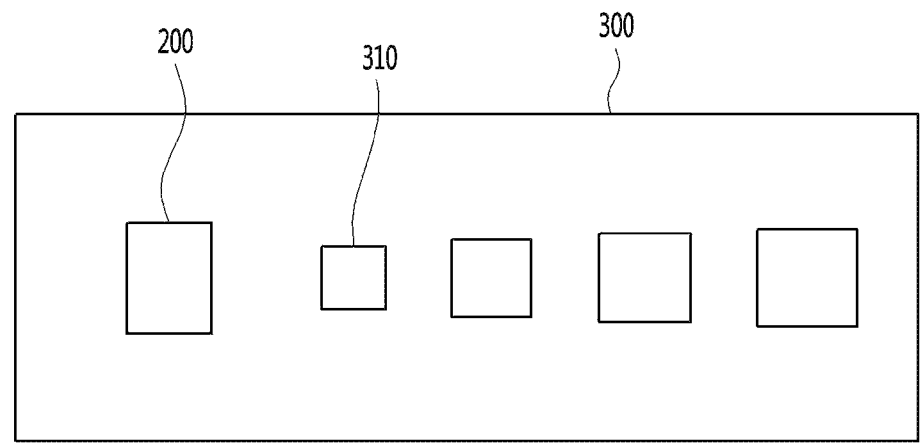

FIGS. 4 and 5 are plan views illustrating a modified example of the reflective pattern 310 of the lighting device 1000 according to the embodiment. Referring to FIG. 4, the density of the reflective patterns 310 may increase as the distance from the emission surface 210 of the light emitting device 200 increases. For example, the area of the plurality of reflective patterns 310 may be the same, and the distance between the adjacent reflective patterns 310 may become shorter as the distance from the emission surface 210 of the light emitting device 200 increases. Accordingly, as the distance from the emission surface 210 of the light emitting device 200 increases, the density of the reflective patterns 310 disposed on the reflective layer 302 may increase. Accordingly, as the distance from the light emitting surface 210 of the light emitting device 200 increases, the amount of light reflected by the reflective pattern 310 increases, so that the light uniformity emitted from the light emitting device 200 to the outside may be improved.

Referring to FIG. 5, an area of the plurality of reflective patterns 310 may increase as the distance from the emission surface 210 of the light emitting device 200 increases. For example, the area of the plurality of reflective patterns 310 may increase as the distance from the emission surface 210 of the light emitting device 200 increases. Accordingly, among the plurality of reflective patterns 310, an amount of light reflected by the reflective pattern 310 closest to the light emitting device 200 is the smallest and an amount of light reflected by the reflective pattern 310 farthest from the light emitting device 200 may be the largest, accordingly, the amount of light reflected by the reflective pattern 310 is adjusted according to the distance from the emission surface 210 of the light emitting device 200 and the light uniformity emitted from the light emitting device 200 to the outside may be improved.

Figure 7A:
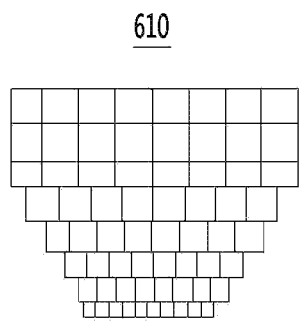
FIGS. 7A to 7C are plan views illustrating an optical pattern of a lighting device according to an embodiment.
Figure 7B:
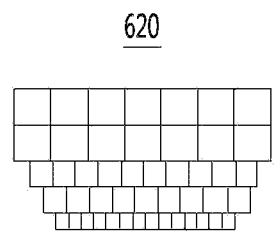
Figure 7C:
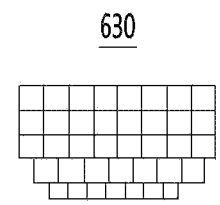
Figure 8:
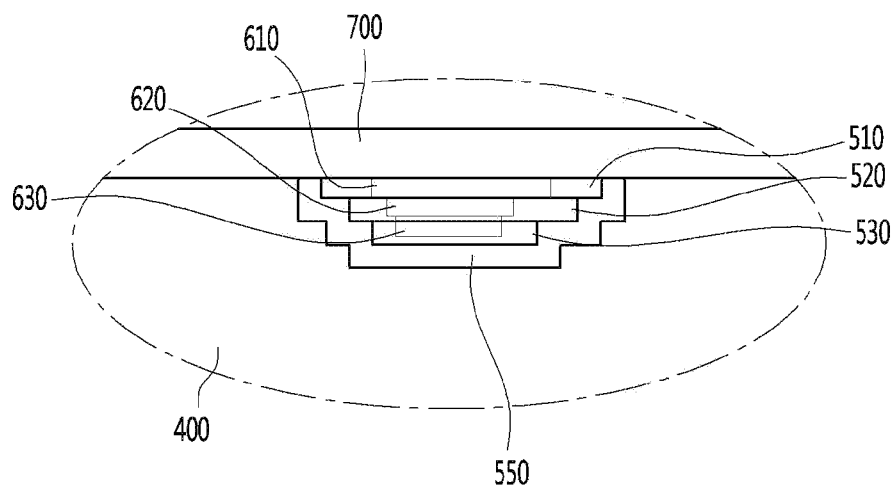
FIG. 8 is a cross-sectional view illustrating a region B of a lighting device according to another exemplary embodiment.

As described above, in the lighting device 1000 according to the embodiment, light uniformity may be improved by adjusting the density and area of the reflective pattern 310 as shown in FIGS. 7 and 8.

Again, referring to FIG. 2, the resin layer 400 may be disposed on the circuit substrate 100. The resin layer 400 may face the circuit substrate 100. The resin layer 400 may be disposed on the entire or partial region of the upper surface of the circuit substrate 100. The area of the lower surface of the resin layer 400 may be the same as or smaller than the area of the upper surface of the circuit substrate 100. The resin layer 400 may be formed of a transparent material. The resin layer 400 may include a resin material such as silicone or epoxy. The resin layer 400 may include a thermosetting resin material. For example, it may optionally include PC, OPS, PMMA, PVC, and the like. The resin layer 400 may be formed of glass, but is not limited thereto. For example, the main material of the resin layer 400 may be a resin material having a urethane acrylate oligomer as a main material. For example, a mixture of urethane acrylate oligomer, which is a synthetic oligomer, and a polymer type, which is polyacrylic, may be used. Of course, the low-boiling dilution-type reactive monomer IBOA (isobornyl acrylate), HPA (Hydroxylpropyl acrylate, 2-HEA (2-hydroxyethyl acrylate), etc. may further include a mixed monomer, etc., as an additive, a photoinitiator (for example, 1-hydroxycyclohexyl phenyl-ketone, etc.) or antioxidants may be mixed.

Since the resin layer 400 is provided as a layer for guiding light as a resin, it may be provided with a thinner thickness than in the case of glass and may be provided as a flexible plate. The resin layer 400 may emit the point light source emitted from the light emitting device 200 in the form of a line light source or a surface light source.

A bead (not shown) may be included in the resin layer 400, and the bead may diffuse and reflect incident light to increase the amount of light. The beads may be arranged in an amount of 0.01% to 0.3% based on the weight of the resin layer 400. The bead may be composed of any one selected from silicon, silica, glass bubble, polymethyl methacrylate (PMMA), urethane, Zn, Zr, $Al_2O_3$, and acryl, and the particle diameter of the beads may be in the range of about 1 μm to about 20 μm, but is not limited thereto.

Since the resin layer 400 is disposed on the light emitting device 200, it is possible to protect the light emitting device 200 and reduce loss of light emitted from the light emitting device 200. The light emitting device 200 may be buried under the resin layer 400. The resin layer 400 may be in contact with the surface of the light emitting device 200 and may be in contact with the emitting surface 210 of the light emitting device 200.

The thickness z4 of the resin layer 400 may be 1.8 mm or more, for example, 1.8 mm to 2.5 mm. When the thickness z4 of the resin layer 400 is thicker than the above range, the luminous intensity may be lowered, and it may be difficult to provide a flexible module due to an increase in the module thickness. When the thickness z4 of the resin layer 400 is smaller than the above range, it may be difficult to provide a surface light source having a uniform luminous intensity. The light emitted from the light emitting device 200 may be diffused through the resin layer 400 and the diffusion layer 700 disposed on the resin layer 400 to be emitted to the outside.

The diffusion layer 700 may be disposed on the resin layer 400. The diffusion layer 700 may be attached on the resin layer 400 by applying a predetermined pressure or pressure/heat. The diffusion layer 700 is adhered to the resin layer 400 by the self-adhesive force of the resin layer 400 without a separate adhesive, thereby separately attaching an adhesive during the manufacturing process of the lighting device 1000 according to the embodiment may be reduced, and it is possible to avoid the use of adhesives that are harmful to the human body, thereby reducing the wastage of processes and materials.

The diffusion layer 700 may be adhered to the upper surface of the resin layer 400. Since a specific color may not be mixed when the luminous intensity of light is high, the diffusion layer 700 may diffuse and mix the lights. The material of the diffusion layer 700 may be a light-transmitting material. For example, the diffusion layer 700 may include at least one of a polyester (PET) film, a poly methyl methacrylate (PMMA) material, or a polycarbonate (PC) material. The diffusion layer 700 may be provided as a film made of a resin material such as silicone or epoxy. The diffusion layer 700 may include a single layer or multiple layers.

The thickness z5 of the diffusion layer 700 is 25 micrometers or more, and may be, for example, in the range of 25 to 250 micrometers or in the range of 100 to 250 micrometers. The diffusion layer 700 has the thickness z5 in the range and may provide incident light as a uniform surface light source.

The diffusion layer 700 may include at least one or two or more of a diffusion agent such as beads, a phosphor, and ink particles. For example, the phosphor may include at least one of a red phosphor, an amber phosphor, a yellow phosphor, a green phosphor, and a white phosphor. The ink particles may include at least one of metal ink, UV ink, and curing ink. The size of the ink particles may be smaller than the size of the phosphor. The surface color of the ink particles may be any one of green, red, yellow, and blue. The ink types may be selectively applied among PVC (Poly vinyl chloride) ink, PC (Polycarbonate) ink, ABS (acrylonitrile butadiene styrene copolymer) ink, UV resin ink, epoxy ink, silicone ink, PP (polypropylene) ink, water-based ink, plastic ink, PMMA (poly methyl methacrylate) ink and PS (Polystyrene) ink. The ink particles may include at least one of metal ink, UV ink, and curing ink.

The optical pattern 600 may be disposed between the diffusion layer 700 and the resin layer 400. The optical pattern 600 may be disposed between the cover layer 500 and the diffusion layer 700. The optical pattern 600 may be adhered to the lower surface of the diffusion layer 700. The optical pattern 600 may be disposed to be spaced apart from the side surface of the resin layer 400. The optical pattern 600 may face the upper surface of the circuit substrate 100. The optical pattern 600 may vertically overlap the light emitting device 200. A plurality of the optical patterns 600 may be arranged in the first direction X. Each of the plurality of optical patterns 600 may overlap each of the plurality of light emitting devices 200 in the third direction Z or the vertical direction. The interval between the plurality of optical patterns 600 may be smaller than the interval x2 between the light emitting devices 200, but is not limited thereto. Each of the plurality of optical patterns 600 may include the same shape, but is not limited thereto. The optical pattern 600 may be made of a material having a refractive index equal to that of air or a refractive index lower than that of the resin layer 420.

Figure 6:
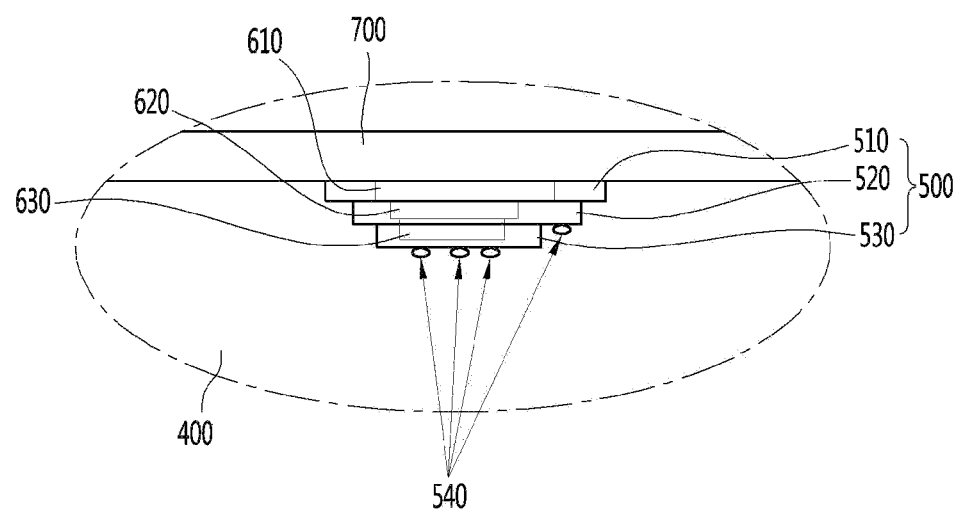
FIG. 6 is a cross-sectional view illustrating a region B of the lighting device according to the embodiment.

Referring to FIGS. 6 and 7, the optical pattern 600 may be arranged in a first optical pattern 610 on the lower surface of the diffusion layer 700, and a second optical pattern 620 under the first optical pattern 610, a third optical pattern 630 under the second optical pattern 620. Areas of the first optical pattern 610 to the third optical pattern 630 may be different from each other. For example, an area of the first optical pattern 610 may be larger than an area of the second optical pattern 620 and the optical pattern 630. An area of the second optical pattern 620 may be larger than an area of the third optical pattern 630. The thickness of the first optical pattern 610 to the third optical pattern 630 may be 8 to 12 micrometers. For example, the thickness of the first optical pattern 610 to the third optical pattern 630 may be 10 micrometers.

As shown in FIG. 7, each of the first optical pattern 610 to the third optical pattern 630 may be formed by a plurality of dot patterns. The area of the dot patterns constituting the first optical pattern 610 to the third optical pattern 630 may decrease as the distance from the light emitting device 200 increases. Accordingly, the light uniformity of the light emitting device may be improved by adjusting the amount of light reflected by the dot patterns and the amount of light blocked by the dot patterns.

The optical pattern 600 may be provided on each of the light emitting devices 200 with a size or area sufficient to prevent hot spots caused by light emitted in the emission direction of the light emitting devices 200. In addition, in the optical pattern 600, since the light emitting device 200 emits light in the side direction, that is, in the first direction X, it covers a region capable of increasing light blocking efficiency due to the distribution of the light beam angle of the light emitting device 200 and the reflection characteristics of light. Therefore, in the lighting device 1000 according to the embodiment, the optical pattern 600 may prevent a hot spot caused by the light emitted from the light emitting device 200 and improve the light extraction efficiency of the light emitting device 200.

The cover layer 500 may be disposed between the optical pattern 600 and the resin layer 400. The cover layer 500 may be disposed between the diffusion layer 700 and the resin layer 400. The cover layer 500 may be disposed under the lower surface of the diffusion layer 700. The cover layer 500 may be formed to surround the optical pattern 600.

The cover layer 500 may include a first cover layer 510 surrounding a portion of a side surface and a lower surface of the first optical pattern 610, and a second cover layer 520 surrounding a portion of a side surface and a lower surface of the second optical pattern 620, and a third cover layer 530 surrounding a side surface and a lower surface of the third optical pattern 630. The first cover layer 510 may be disposed under the lower surface of the diffusion layer 700. The second cover layer 520 may be disposed under the first cover layer 510. The third cover layer 530 may be disposed under the second cover layer 520.

Areas of the first cover layer 510 to the third cover layer 530 may be different from each other. For example, an area of the first cover layer 510 may be larger than an area of the second cover layer 520 and the third cover layer 530. An area of the second cover layer 520 may be larger than an area of the third cover layer 530. The area of each of the first cover layer 510 to the third cover layer 530 may be greater than area of each of the first optical pattern 610 to third optical pattern 630 corresponding to each of the first cover layer 510 to the third cover layer 530.

The thickness of the cover layer 500 may be 3 to 10 micrometers. For example, the thickness of each of the first cover layer 510 to the third cover layer 530 may be 1 to 3.3 micrometers, but is not limited thereto.

The cover layer 500 may include a release agent. For example, the cover layer 500 may be formed of an inorganic powder, for example, a release agent containing talc, kaolin, mica, and clay. For example, the cover layer 500 may be formed with a silicone release agent or an acrylic resin formed of a silicone resin containing silicone, a silicon compound, silicone rubber, silicone oil, silicone oil, methyl silicone oil, a silicon resin, a silicone release agent formed of silicone resin containing a silicone resin emulsion, or an acrylic release agent containing an acrylic resin. For example, the cover layer 500 may be formed of a release agent including plant, animal, and wax with synthetic paraffin. The cover layer 500 may be formed of a release agent formed of a fluorine resin powder, or a fluorine resin paint.

The cover layer 500 may be formed of a release agent and may not include adhesive properties. Accordingly, the cover layer 500 formed to surround the optical pattern 600 may not adhere to the resin layer 400. Therefore, an air gap 540 may be formed between the cover layer 500 and the resin layer 400 without going through a separate manufacturing process due to the material properties of the resin layer 400 and the cover layer 500. In the lighting device 1000 according to the embodiment, the air gap 540 is formed according to the material properties of the resin layer 400 and the cover layer 500, so that the air gap 540 are formed the cover layer 500 and the resin layer 400 without a separate manufacturing process, and a light extraction efficiency of the light emitting device 200 according to a difference in refractive indies between the resin layer 400, the cover layer 500, and the air gap 540 may be improved.

In the conventional lighting device, an air gap may be formed between the optical pattern and the resin layer by forming a separate PET film on the optical pattern and forming the PSA between the resin layer and the optical pattern. However, separate PET film and PSA are required to form an air gap, thereby increasing the manufacturing process and improving the manufacturing cost. In the lighting device 1000 according to the embodiment, the optical pattern 600 is surrounded by a cover layer 500 that does not include an adhesive property, and an air gap 540 may be formed between the resin layer 400 and the cover layer 500 according to the material properties of the cover layer 500 and the resin layer 400. Accordingly, in the lighting device 1000 according to the embodiment, a separate manufacturing process is not required to form the air gap 540 as in the prior art, and since the air gap 540 can be formed according to the material properties of the cover layer 500 and the resin layer 400, a manufacturing cost may be reduced. In addition, the light extraction efficiency of the lighting device 1000 may be increased by the difference in refractive indices between the resin layer 400, the cover layer 500 and the air gap 540 formed between the cover layer 500 and the resin layer 400. In addition, since separate PSA and PET films are not required to form an air gap as in the prior art, light efficiency and flexibility of the lighting device 1000 may be increased.

FIG. 8 is a view showing a modified example of the lighting device 100 according to the embodiment. In FIG. 8, a previously described descriptions in the lighting module according to the embodiment shown in FIGS. 1 to 7 may be adopted.

The air gap 550 may be disposed between the resin layer 400 and the cover layer 600. The air gap 550 may separate the resin layer 400 and the cover layer 600 by a predetermined distance. The side and lower surfaces of the cover layer 500 and the resin layer 400 may be spaced apart from each other by a predetermined distance by the air gap 550. Except for the lower surface of the diffusion layer 700 in contact with the air gap 550, the lower surface of the diffusion layer 700 and the upper surface of the resin layer 400 may be adhered.

In the lighting device 100 according to the embodiment, the air gap 550 is formed between the resin layer 400 and the cover layer 500 according to material properties of the resin layer 400 and the cover layer 500 so that the air gap 550 may be spaced apart from the resin layer 400 and the cover layer 500 by a predetermined distance. In addition, the lower surface of the diffusion layer 700 may be adhered to the resin layer 400 by adhesion properties. Accordingly, an air gap 550 is formed between the resin layer 400 and the cover layer 500 without a separate manufacturing process, and a difference in the refractive indices of the resin layer 400, the cover layer 500, and the air gap 550 may improve a light extraction efficiency of the light emitting device 200.

Figure 9:
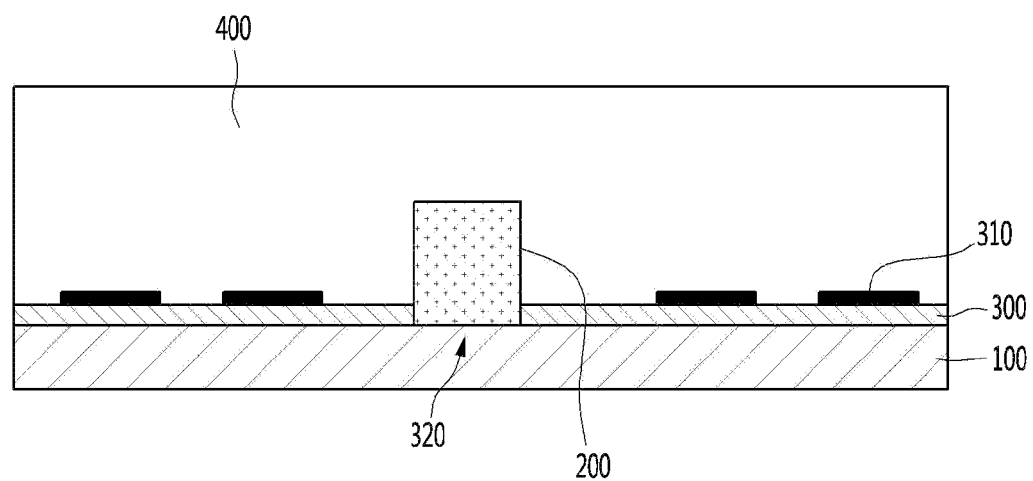
FIGS. 9 and 10 are cross-sectional views illustrating a manufacturing process of a lighting device according to an embodiment.
Figure 10:
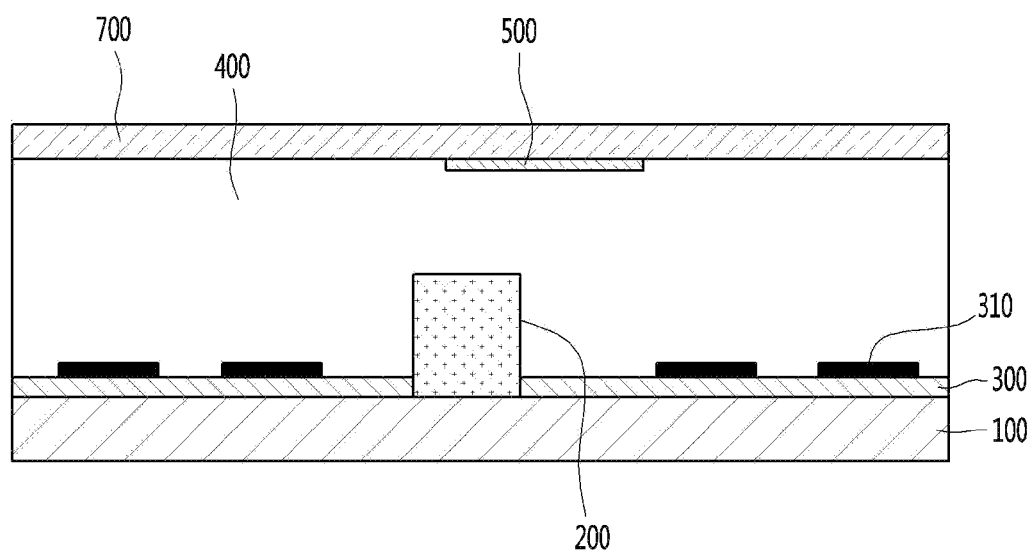

FIGS. 9 and 10 are views illustrating a manufacturing process of the lighting device 1000 according to the embodiment. Referring to FIG. 9, the reflective member 300 including the opening 320 is attached to the circuit substrate 100. The light emitting device 200 is adhered with a conductive adhesive member through the opening 320 of the circuit substrate 100. Here, the reflective member 300 may include an adhesive layer 301, a reflective layer 302 having bubbles, and a reflective pattern 310 as shown in FIG. 3.

The resin layer 400 is dispensed on the circuit substrate 100 and the light emitting device 200. The resin layer 400 may include a transparent material such as silicone or epoxy.

Referring to FIG. 10, an optical pattern 600 may be formed under the diffusion layer 700, and a release agent may be sprayed or printed on a part or all of the optical pattern 600 to form the cover layer 500. Thereafter, the diffusion layer 700 is pressed onto the upper surface of the resin layer 400 and attached thereto using a compression device, for example, a roller (not shown). In this case, the diffusion layer 700 may be closely adhered to the upper surface of the resin layer 400 due to the adhesive properties of the upper surface of the resin layer 400. In addition, the cover layer 500 is formed of a release agent that does not include adhesive properties, so that the resin layer 400 and the cover layer 500 are not adhered, but the diffusion layer 700 and an upper surface of the resin layer 400 are adhered to each other by pressing equipment to form an air gap 540 and 550 between the cover layer 500 and the resin layer 400. When the diffusion layer 700 is adhered to the resin layer 400, a lighting device may be provided. Such a lighting device may be provided in the size of a unit module. Also, by cutting the rear side of the light emitting device, a plurality of light emitting cells each having a resin layer/diffusion layer on each of the light emitting devices 200 may be separated.

Accordingly, in the lighting device 1000 according to the embodiment, since the air gaps 540 and 550 are formed according to the characteristics of the material, a separate manufacturing process for forming the air gaps 540 and 550 is not required, thereby reducing the manufacturing cost. In addition, since a separate PET film and a PSA are not required to form the air gaps 540 and 550 as in the prior art, a separate PSA and a PET film are not required, thereby increasing the light efficiency and flexibility of the lighting device. In addition, the light extraction efficiency of the lighting device 1000 may be improved due to a difference in refractive indices between the air gaps 540 and 550, the resin layer 400, and the optical pattern 600.

Figure 11:
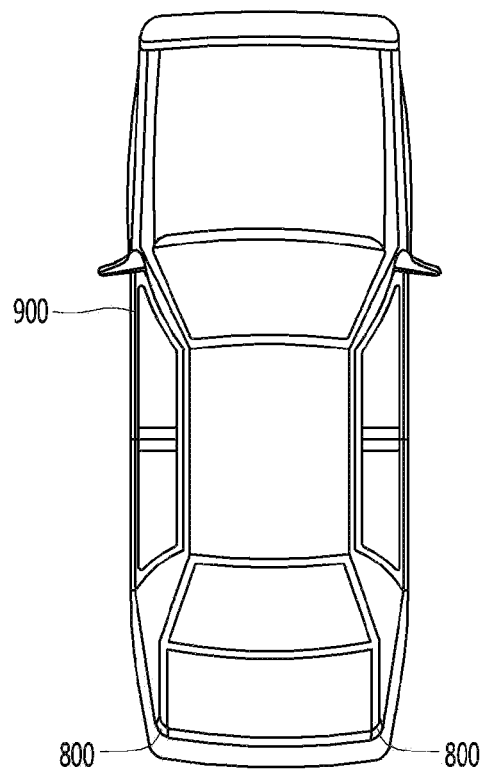
FIG. 11 is a plan view of a vehicle to which a lamp including a lighting device according to an embodiment is applied.
Figure 12:
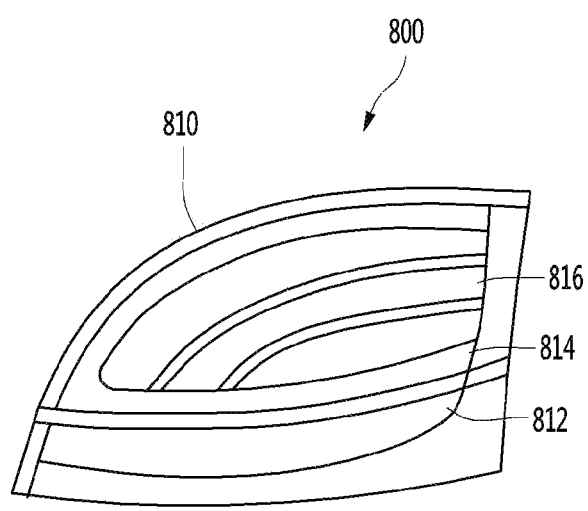
FIG. 12 is a view showing a lamp having a lighting device according to an embodiment.

FIG. 11 is a plan view of a vehicle to which a vehicle lamp to which a lighting module is applied according to an embodiment is applied, and FIG. 12 is a view showing a vehicle lamp having a lighting module or a lighting device disclosed in the embodiment.

Referring to FIGS. 11 and 12, the tail light 800 in the vehicle 900 may include a first lamp unit 812, a second lamp unit 814, a third lamp unit 816, and a housing 810. Here, the first lamp unit 812 may be a light source serving as a turn indicator, the second lamp unit 814 may be a light source serving as a sidelight, and the third lamp unit 816 may be a light source serve as a brake light, but is not limited thereto. At least one or all of the first to third lamp units 812, 814, and 816 may include the lighting module disclosed in the embodiment. The housing 810 accommodates the first to third lamp units 812, 814, and 816, and may be made of a light-transmitting material. In this case, the housing 810 may have a curve according to the design of the vehicle body, and the first to third lamp units 812, 814, and 816 may be implemented to a surface light source having a curved surface according to the shape of the housing 810. Such a vehicle lamp may be applied to a turn signal lamp of a vehicle when the lamp unit is applied to a tail lamp, a brake lamp, or a turn signal lamp of a vehicle.

Features, structures, effects, etc. described in the above embodiments are included in at least one embodiment of the invention, and are not necessarily limited to only one embodiment. Furthermore, features, structures, effects, etc. illustrated in each embodiment may be combined or modified for other embodiments by those of ordinary skill in the art to which the embodiments belong. Accordingly, the contents related to such combinations and modifications should be interpreted as being included in the scope of the invention.

In addition, although the embodiment has been described above, it is only an example and does not limit the invention, and those of ordinary skill in the art to which the invention pertains are exemplified above in a range that does not depart from the essential characteristics of the present embodiment. It may be seen that various modifications and applications that have not been made are possible. For example, each component specifically shown in the embodiment may be implemented by modification. And the differences related to these modifications and applications should be construed as being included in the scope of the invention defined in the appended claims.

The invention claimed is:

1. A lighting device comprising:
a substrate;
a light emitting device disposed on the substrate;
a resin layer disposed on the light emitting device and covering the light emitting device;
a diffusion layer disposed on the resin layer;
an optical pattern disposed between the diffusion layer and the resin layer; and
a cover layer surrounding the optical pattern and disposed on the resin layer,
wherein the optical pattern includes a first optical pattern disposed under the diffusion layer, a second optical pattern disposed under the first optical pattern, and a third optical pattern disposed under the second optical pattern,
wherein the first to third optical patterns overlap the light emitting device in a vertical direction from a lower surface of the substrate toward an upper surface of the diffusion layer,
wherein the first to third optical patterns have different areas and is stacked in the vertical direction,
wherein the area of the second optical pattern is larger than the area of the third optical pattern,
wherein a plurality of air gaps disposed between the cover layer and the resin layer, and
wherein the plurality of air gaps is in contact with the resin layer.

2. The lighting device of claim 1,
wherein the area of the first optical pattern is larger than the area of the second optical pattern.

3. The lighting device of claim 2,
wherein the first optical pattern includes a plurality of dot patterns,
wherein an area of each of the plurality of dot patterns becomes smaller as a distance from the light emitting device increases.

4. The lighting device of claim 1,
wherein the optical pattern is arranged in plurality,
wherein the light emitting device is arranged in plurality,
wherein each of the plurality of optical patterns vertically overlaps each of the plurality of light emitting devices.

5. The lighting device of claim 4,
wherein the first optical pattern has a first portion and a second portion, and
wherein the first portion of the first optical pattern does not vertically overlap with the second optical pattern and the third optical pattern, and the second portion of the first optical pattern does not vertically overlap with the third optical pattern.

6. The lighting device of claim 5,
wherein the second optical pattern has a first portion, and
wherein the first portion of the second optical pattern does not vertically overlap with the third optical pattern.

7. The lighting device of claim 6,
wherein the second portion of the first optical pattern and the first portion of the second optical pattern vertically overlap each other.

8. A lighting device comprising:
a substrate;
a light emitting device disposed on the substrate;
a resin layer disposed on the light emitting device and covering the light emitting device;
a diffusion layer disposed on the resin layer;
an optical pattern disposed between the diffusion layer and the resin layer; and
a cover layer surrounding the optical pattern,
wherein a partial region of the diffusion layer is spaced apart from the resin layer,
wherein the optical pattern vertically overlaps the light emitting device,
wherein a plurality of air gaps disposed between the cover layer and the resin layer, and
wherein the plurality of air gaps is in contact with the resin layer.

9. The lighting device of claim 8,
wherein the optical pattern includes a first optical pattern disposed under the diffusion layer, a second optical pattern disposed under the first optical pattern, and a third optical pattern disposed under the second optical pattern,
wherein an area of the second optical pattern is smaller than an area of the first optical pattern and larger than an area of the third optical pattern.

10. The lighting device of claim 9,
wherein the first optical pattern includes a plurality of dot patterns,
wherein an area of each of the plurality of dot patterns becomes smaller as a distance from the light emitting device increases.

11. The lighting device of claim 8,
wherein the optical pattern is arranged in plurality,
wherein the light emitting device is arranged in plurality,
wherein each of the plurality of optical patterns vertically overlaps each of the plurality of light emitting devices.

12. The lighting device of claim 11,
wherein the first optical pattern has a first portion and a second portion, and
wherein the first portion of the first optical pattern does not vertically overlap with the second optical pattern and the third optical pattern, and the second portion of the first optical pattern does not vertically overlap with the third optical pattern.

13. The lighting device of claim 12,
wherein the second optical pattern has a first portion, and the first portion of the second optical pattern does not vertically overlap with the third optical pattern.

14. The lighting device of claim 13,
wherein the second portion of the first optical pattern and the first portion of the second optical pattern vertically overlap each other.

15. A lighting device comprising:
a substrate;
a reflective member disposed on the substrate;
a plurality of light emitting devices disposed on the substrate;
a resin layer disposed on the reflective member and the plurality of light emitting devices and covering an upper surface and side surfaces of each of the plurality of light emitting devices;
a diffusion layer disposed on the resin layer;
a plurality of optical patterns disposed between the diffusion layer and the resin layer; and
a cover layer surrounding side and lower surfaces of each of the plurality of optical patterns,
wherein the plurality of optical patterns is vertically overlapped with each of the plurality of light emitting devices,
wherein a plurality of air gaps disposed between the cover layer and the resin layer, and
wherein the plurality of air gaps is in contact with the resin layer.

16. The lighting device of claim 15,
wherein the optical pattern includes a first optical pattern disposed under the diffusion layer, a second optical pattern disposed under the first optical pattern, and a third optical pattern disposed under the second optical pattern, and
wherein an area of the second optical pattern is larger than an area of the third optical pattern and smaller than an area of the first optical pattern.

* * * * *